United States Patent
Lanio et al.

(10) Patent No.: US 9,666,405 B1
(45) Date of Patent: May 30, 2017

(54) SYSTEM FOR IMAGING A SIGNAL CHARGED PARTICLE BEAM, METHOD FOR IMAGING A SIGNAL CHARGED PARTICLE BEAM, AND CHARGED PARTICLE BEAM DEVICE

(71) Applicant: ICT Integrated Circuit Testing Gesellschaft für Halbleiterprüftechnik mbH, Heimstetten (DE)

(72) Inventors: Stefan Lanio, Erding (DE); Jürgen Frosien, Riemerling (DE); Matthias Firnkes, Walpertskirchen (DE); Benjamin John Cook, München (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 15/046,905

(22) Filed: Feb. 18, 2016

(51) Int. Cl.
*H01J 37/147* (2006.01)
*H01J 37/29* (2006.01)
*H01J 37/244* (2006.01)
*H01J 37/12* (2006.01)

(52) U.S. Cl.
CPC ........... *H01J 37/147* (2013.01); *H01J 37/12* (2013.01); *H01J 37/244* (2013.01); *H01J 37/29* (2013.01); *H01J 2237/152* (2013.01)

(58) Field of Classification Search
USPC ......................................... 250/397, 396 ML
See application file for complete search history.

(56) References Cited

U.S. PATENT DOCUMENTS

2017/0003235 A1* 1/2017 Firnkes .................. G01N 23/22

* cited by examiner

Primary Examiner — Kiet T Nguyen
(74) Attorney, Agent, or Firm — Kilpatrick Townsend & Stockton LLP

(57) ABSTRACT

The present disclosure provides a system for imaging a signal charged particle beam emanating from a sample by impingement of a primary charged particle beam. The system includes a detector arrangement having a first detection element for detecting a first signal charged particle sub-beam of the signal charged particle beam originating from a first spot on the sample and a second detection element for detecting a second signal charged particle sub-beam of the signal charged particle beam originating from a second spot on the sample, wherein the first detection element and the second detection element are separated from each other, and signal charged particle optics. The signal charged particle optics includes a coil configured to generate a magnetic field having a magnetic field component parallel to a longitudinal axis of the coil, wherein the magnetic field acts on the first signal charged particle sub-beam and the second signal charged particle sub-beam propagating along the longitudinal axis, and wherein an aspect ratio of the coil is at least 1, and a controller configured to adjust the magnetic field of the coil such that the first signal charged particle sub-beam is directed towards the first detection element and the second signal charged particle sub-beam is directed towards the second detection element.

16 Claims, 4 Drawing Sheets

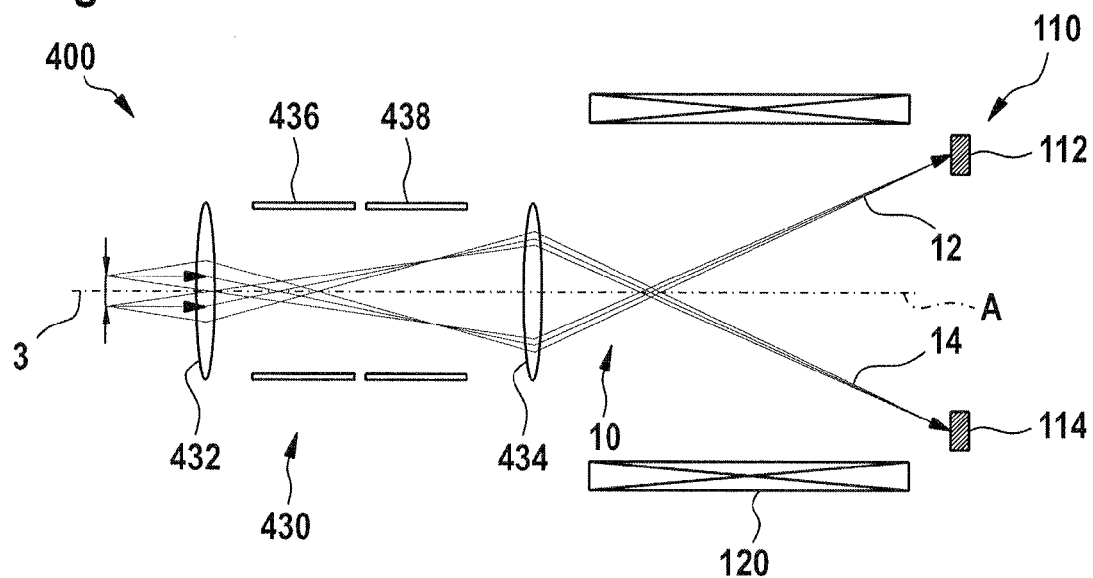
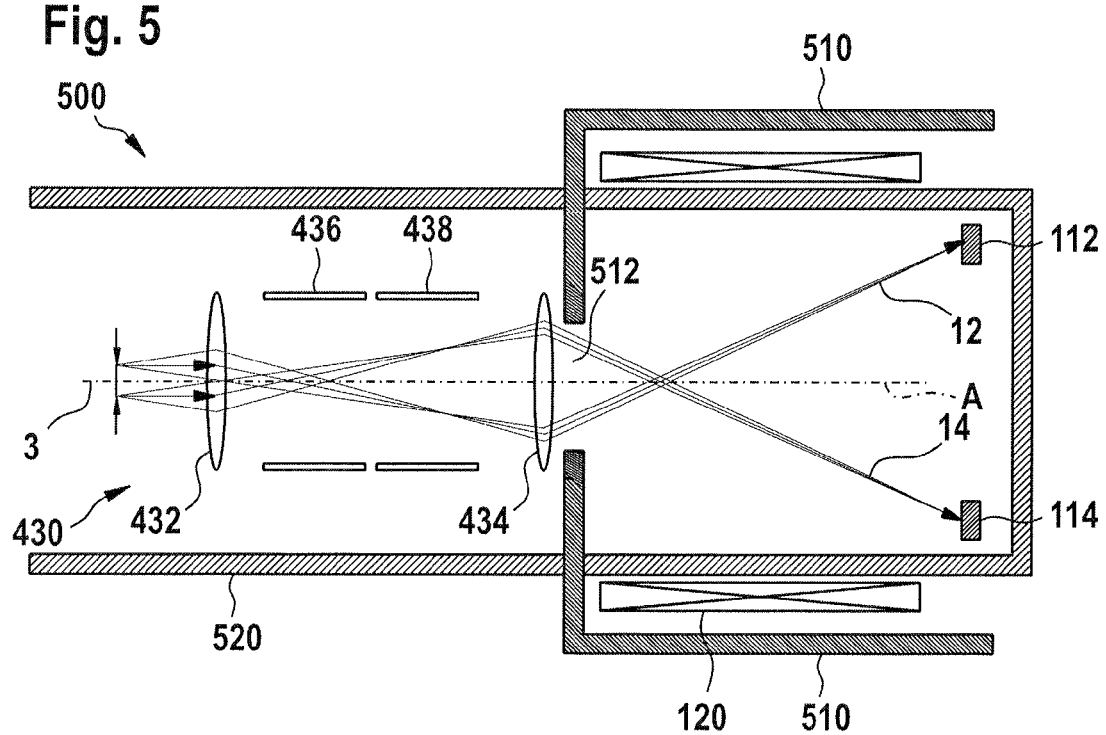

SYSTEM FOR IMAGING A SIGNAL CHARGED PARTICLE BEAM, METHOD FOR IMAGING A SIGNAL CHARGED PARTICLE BEAM, AND CHARGED PARTICLE BEAM DEVICE

FIELD

Embodiments of the present disclosure relate to a system for imaging a signal charged particle beam emanating from a sample by impingement of a primary charged particle beam, a method for imaging a signal charged particle beam, and a charged particle beam device. Embodiments of the present disclosure particularly relate to charged particle beam devices for multibeam detection.

BACKGROUND

Charged particle beam devices have many functions in a plurality of industrial fields, including, but not limited to, electron beam inspection (EBI), critical dimension (CD) measurements of semiconductor devices during manufacturing, defect review (DR) of semiconductor devices during manufacturing, exposure systems for lithography, detecting devices and testing systems. Thus, there is a high demand for structuring, testing and inspecting specimens within the micrometer and nanometer scale. Micrometer and nanometer scale process control, inspection or structuring can be done with charged particle beams, e.g. electron beams, which are generated and focused in charged particle beam devices, such as electron microscopes. Charged particle beams offer superior spatial resolution compared to, for example, photon beams due to their short wavelengths.

High throughput electron beam inspection (EBI) systems can utilize multibeam charged particle beam devices, such as electron microscopes, that are able to create, focus and scan multiple primary charged particle beams inside a single column of the charged particle beam device. A sample can be scanned by an array of focused primary charged particle beams, which in turn create multiple signal charged particle beams. The individual signal charged particle beams are mapped onto detection elements. A rotational position of the multiple signal charged particle beams can be influenced by operating parameters of the charged particle beam device. Accordingly, a rotational position of the multiple signal charged particle beams can change, for example, when an image mode of the charged particle beam device is changed. The individual signal charged particle beams cannot reliably be mapped onto the detection elements anymore.

In view of the above, systems, methods and charged particle beam devices are beneficial that overcome at least some of the problems in the art. In particular, systems, methods and charged particle beam devices are beneficial that can reliably map individual signal charged particle beams onto detection elements, even when operating parameters of the charged particle beam device are changed.

SUMMARY

In light of the above, a system for imaging a signal charged particle beam emanating from a sample by impingement of a primary charged particle beam, a method for imaging a signal charged particle beam, and a charged particle beam device are provided. Further aspects, benefits, and features of the present disclosure are apparent from the claims, the description, and the accompanying drawings.

According to an aspect of the present disclosure, a system for imaging a signal charged particle beam emanating from a sample by impingement of a primary charged particle beam is provided. The system includes a detector arrangement having a first detection element for detecting a first signal charged particle sub-beam of the signal charged particle beam originating from a first spot on the sample and a second detection element for detecting a second signal charged particle sub-beam of the signal charged particle beam originating from a second spot on the sample, wherein the first detection element and the second detection element are separated from each other, and signal charged particle optics. The signal charged particle optics includes a coil configured to generate a magnetic field having a magnetic field component parallel to a longitudinal axis of the coil, wherein the magnetic field acts on the first signal charged particle sub-beam and the second signal charged particle sub-beam propagating along the longitudinal axis, and wherein an aspect ratio of the coil is at least 1, and a controller configured to adjust the magnetic field of the coil such that the first signal charged particle sub-beam is directed towards the first detection element and the second signal charged particle sub-beam is directed towards the second detection element.

According to another aspect of the present disclosure, a method for imaging a signal charged particle beam is provided. The method includes a directing of a primary charged particle beam having a plurality of primary charged particle sub-beams onto the sample to generate a first signal charged particle sub-beam of the signal charged particle beam originating from a first spot on the sample and a second signal charged particle sub-beam of the signal charged particle beam originating from a second spot on the sample, a guiding of the first signal charged particle sub-beam and the second signal charged particle sub-beam through a coil, a rotating of the first signal charged particle sub-beam and the second signal charged particle sub-beam around a longitudinal axis of the coil using a magnetic field of the coil, and a detecting of the first signal charged particle sub-beam by a first detection element and detecting the second signal charged particle sub-beam by a second detection element spaced apart from the first detection element.

According to yet another aspect of the present disclosure, a charged particle beam device is provided. The charged particle beam device includes a charged particle beam emitter configured for emission of a primary charged particle beam, a sample stage configured for supporting a sample, an objective lens configured for focusing the primary charged particle beam onto the sample, a beam separator configured for separating the primary charged particle beam and a signal charged particle beam formed upon impact of the primary charged particle beam onto the sample, and the system for imaging a signal charged particle beam emanating from a sample by impingement of a primary charged particle beam according to the embodiments described herein.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The method includes method aspects for carrying out every function of the apparatus.

BRIEF DESCRIPTION OF THE DRAWINGS

So that the manner in which the above recited features of the present disclosure can be understood in detail, a more particular description of the disclosure, briefly summarized above, may be had by reference to embodiments. The accompanying drawings relate to embodiments of the disclosure and are described in the following:

FIG. 4 shows a schematic view of the system for imaging a signal charged particle beam according to further embodiments described herein;

FIG. 5 shows a schematic view of the system for imaging a signal charged particle beam according to yet further embodiments described herein;

DETAILED DESCRIPTION OF EMBODIMENTS

Figure 1:
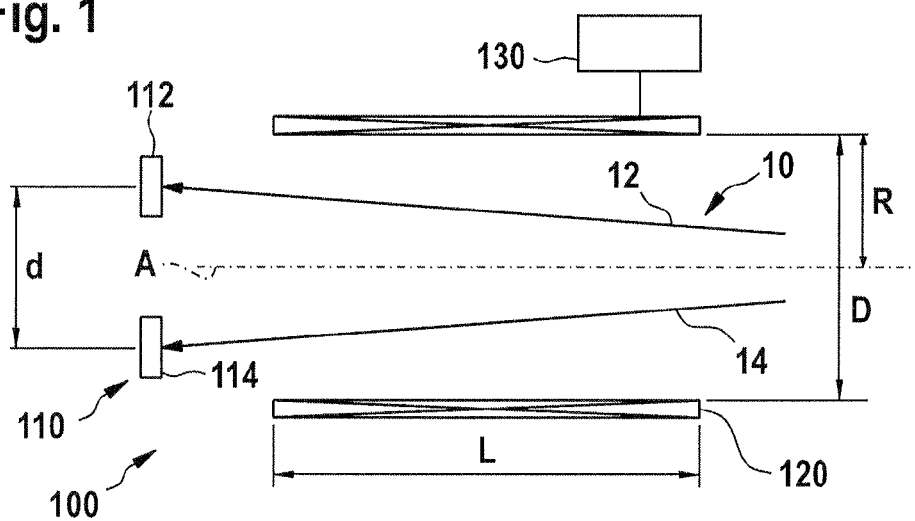
FIG. 1 shows a schematic view of the system for imaging a signal charged particle beam according to embodiments described herein.

Reference will now be made in detail to the various embodiments of the disclosure, one or more examples of which are illustrated in the figures. Within the following description of the drawings, the same reference numbers refer to same components. Only the differences with respect to individual embodiments are described. Each example is provided by way of explanation of the disclosure and is not meant as a limitation of the disclosure. Further, features illustrated or described as part of one embodiment can be used on or in conjunction with other embodiments to yield yet a further embodiment. It is intended that the description includes such modifications and variations.

Without limiting the scope of protection of the present application, in the following the charged particle beam device or components thereof will exemplarily be referred to as a charged particle beam device using electrons as charged particles. However, other types of primary charged particles, e.g. ions, could be used. Upon irradiation of a specimen or sample by a charged particle beam (also referred to as "primary charged particle beam"), signal charged particles, such as secondary electrons (SE), are created, which may carry information about the topography, chemical constituents and/or electrostatic potential of the sample and others. The secondary electrons can include at least one of back-scattered electrons and Auger electrons. The signal charged particles can be collected and guided to a sensor, e.g., a scintillator, a pin diode or the like.

High throughput electron beam inspection (EBI) systems can utilize multibeam charged particle beam devices, such as electron microscopes, that are able to create, focus and scan multiple primary charged particle beams ("primary charged particle sub-beams") inside a single column of the charged particle beam device. A sample can be scanned by an array of focused primary charged particle sub-beams, which in turn create multiple signal charged particle beams ("signal charged particle sub-beams"). The individual signal charged particle sub-beams are mapped onto separate detection elements. The mapping can include at least one of (i) focusing each signal charged particle sub-beam, e.g., into a small spot, (ii) adjusting a magnification of the resulting spot pattern of the signal charged particle sub-beams to a separation (pitch) of the detection elements, and (iii) adjusting the rotation of the spot pattern of the signal charged particle sub-beams to the actual position of the detection elements. In some implementations, the focus and the magnification of the spot pattern of the signal charged particle sub-beams can be adjusted using a two-lens electrostatic secondary electron optics system.

The present disclosure allows to control the rotation of the spot pattern of the signal charged particle sub-beams in a detector plane. In particular, in order to detect the magnified signal charged particle sub-beams (also referred to as "beamlets"), an angular position of the signal charged particle sub-beams is matched to an angular position of the detector elements in the detector plane. In EBI columns, a rotation of the signal charged particle sub-beams can be influenced by an objective lens excitation for the primary charged particle beam. As an example, by switching from one image mode to another image mode, e.g., from a landing energy of 0.1 keV and an extraction field of 1000 V/mm (LE0.1 G1000) to LES G2000, a rotational position of the signal charged particle sub-beams on the detector plane can change by about 30°.

The rotation correction of the present disclosure is conducted using a coil, such as a solenoid coil, having a high aspect ratio of at least 1. The coil can be arranged in a long drift space of a multibeam detection system in front of a detector arrangement. By implementing the coil e.g. in the drift space, a defined amount of Larmor rotation can be introduced, wherein the original focusing properties of the signal charged particle sub-beams remain substantially unchanged. The rotation control of the present disclosure can be easily implemented. Further, the rotation correction of the present disclosure allows to compensate the rotation independent from the focusing and/or the magnification. According to some embodiments of the present disclosure, which can be combined with other embodiments described herein, the aspect ratio can be at least 2.

FIG. 1 shows a schematic view of the system 100 for imaging a signal charged particle beam emanating from a sample by impingement of a primary charged particle beam according to embodiments described herein. A "sample" as referred to herein includes, but is not limited to, semiconductor wafers, semiconductor workpieces, and other workpieces such as memory disks and the like. Embodiments of the disclosure may be applied to any workpiece on which material is deposited or workpiece which is structured.

The system 100 includes a detector arrangement 110 having a first detection element 112 for detecting a first signal charged particle sub-beam 12 of the signal charged particle beam 10 originating from a first spot on the sample and a second detection element 114 for detecting a second signal charged particle sub-beam 14 of the signal charged particle beam 10 originating from a second spot on the sample. The first detection element 112 and the second detection element 114 are separated from each other by a distance d. The distance d can be a distance between centers or middle portions of the respective detection elements. As an example, the distance d can be a distance between a first center or middle portion of the first detection element 112 and a second center or middle portion of the second detection element 114. The distance d can be at least 1 mm, specifically at least 5 mm, and more specifically at least 10 mm. In some implementations, the distance d is about 5 mm.

As used throughout the present disclosure, the primary charged particle beam impinging on the sample consists of multiple primary charged particle sub-beams, which may be separated or spaced apart from each other. Likewise, the signal charged particle beam consists of multiple signal charged particle sub-beams, which may be separated or spaced apart from each other.

The system 100 further includes signal charged particle optics. The signal charged particle optics includes a coil 120 configured to generate a magnetic field having a magnetic field component parallel to a longitudinal axis A of the coil 120. According to some embodiments, which can be combined with other embodiments described herein, the coil 120 can be a solenoid coil. The magnetic field, e.g., the magnetic field component parallel to the longitudinal axis A, acts on the first signal charged particle sub-beam 12 and the second signal charged particle sub-beam 14 propagating along the longitudinal axis A. In some implementations, the longitudinal axis A can be a section of an optical axis of the system 100. Although FIG. 1 illustrates a signal charged particle beam 10 having two signal charged particle sub-beams, it is to be understood that the present disclosure is not limited thereto and that any number of signal charged particle sub-beams can be provided. In particular, the number of signal charged particle sub-beams can correspond to a number of spots on the sample or a number of primary charged particle sub-beams impinging on the sample.

The system 100 includes a controller 130 configured to adjust the magnetic field of the coil 120 such that the first signal charged particle sub-beam 12 is directed towards the first detection element 112 and the second signal charged particle sub-beam 14 is directed towards the second detection element 114. As an example, the controller 130 can be configured to control a current flowing through the coil 120 in order to adjust the magnetic field generated by the current. The coil 120 is configured as a rotation correction device for correction of a rotation of the first signal charged particle sub-beam 12 and the second signal charged particle sub-beam 14.

An aspect ratio (e.g., L/R and/or L'/R' as described below) of the coil 120 is at least 1, specifically at least 3, more specifically at least 5. In some implementations, the aspect ratio is in a range between 1 and 10, and specifically in a range between 1 and 5. The coil having the high aspect ratio can introduce a predetermined amount of Larmor rotation in the signal charged particle sub-beams independent from focusing and/or magnification optics. The original focusing properties of the signal charged particle sub-beams can remain substantially unchanged.

The coil 120 has a length L along the longitudinal axis A and a radius R perpendicular to the longitudinal axis A. A diameter D of the coil 120 can be twice the radius R. The radius R can be an inner radius of the coil 120, such as a radius of an empty propagation space within the coil 120 that is configured for propagation of the signal charged particle beam 10. In some implementations, the coil 120 is a cylindrical coil. The radius R can be a (inner) radius of the cylinder, and the length L can be a length of the cylinder. The propagation space within the coil 120 can correspond to a cylinder volume of the cylindrical coil. The aspect ratio can be defined as the ratio of the length L and the radius R (L/R). According to some embodiments, the length L is at least 5 cm, specifically at least 10 cm, and more specifically at least 15 cm.

The coil 120 generates the magnetic field within the coil 120, and in particular within the propagation space that is configured for propagation of the signal charged particle beam 10. The magnetic field has a magnetic field component parallel to the longitudinal axis A of the coil 120 and a (much smaller) magnetic field component perpendicular to the longitudinal axis A of the coil 120, specifically at the entrance part and/or the exit part of the coil 120. The magnetic field, e.g., the magnetic field component parallel to the longitudinal axis A acts on the vector components of the charged particle velocity perpendicular to the longitudinal axis A, causing the Larmor rotation of the signal charged particles of the signal charged particle sub-beams with respect to the longitudinal axis A. In other words, the signal charged particles move along a spiral pathway through the coil 120.

According to some embodiments, which can be combined with other embodiments described herein, the coil 120 provides a magnetic field region providing the magnetic field that acts on the signal charged particle sub-beams to cause the Larmor rotation. The magnetic field region has a length L' along the longitudinal axis A and a radius R' perpendicular to the longitudinal axis A. According to some embodiments, the radius R' can correspond to, or be, the radius R of the coil 120, and/or the length L' can correspond to, or be, the length L of the coil 120. The aspect ratio of the coil 120 can be defined as the ratio of the length L' and the radius R' (L'/R') of the magnetic field region. According to some embodiments, the length L' is at least 5 cm, specifically at least 10 cm, and more specifically at least 15 cm.

To compensate a rotation of the signal charged particle sub-beams e.g. introduced by the objective lens excitation, and/or to keep a position of the signal charged particle sub-beams on the detector plane essentially constant, the coil 120 for rotation correction has the high aspect ratio. In more detail, the magnetic field at a center of the coil 120 having N turns can approximately be expressed by $$B = \frac{\mu_0 NI}{\sqrt{4R^2 + L^2}}$$

where $\mu_0$ is the vacuum permeability, NI the coil excitation (Amp-turns), and R and L radius and length of the coil 120. The rotation of the signal charged particles, such as an electron, after travelling through the magnetic field of the coil 120 can approximately be expressed by $$\theta = \frac{eBL}{2mv}$$

with e the electron charge, m the electron mass and v the velocity of the electron (non-relativistic).

The focal length of the coil 120 can be approximated by $$f = \frac{8mV}{eLB^2}$$

with V being the electron potential.

Considering the proportionality between θ and L/R for a fixed NI, the rotation increases strongly for aspect ratios between 1 and 5, while for ratios above 5, the rotation angle settles towards a limit defined by NI. With respect to the rotation angle and the focal length, while the rotation angle increases linearly with NI, the focal length decreases with $1/(NI)^2$. As an example, to correct a rotation angle of ±20°, about 320 AT coil excitation can be used. This leads to a focal length of about 940 mm, which is much larger than the focal length of electrostatic lenses (e.g., tens of mm) used for magnification. An impact of the coil 120 on the focusing of the signal charged particle sub-beams is minimal. In particular, there is a minimal focusing of the signal charged particle sub-beams and a minimal loss of a separation of the signal charged particle sub-beams. According to some embodiments, the loss of separation can be compensated using the electrostatic lenses for magnification, e.g., by changing a lens potential, for example, by about 1 to 5%.

Figure 2:
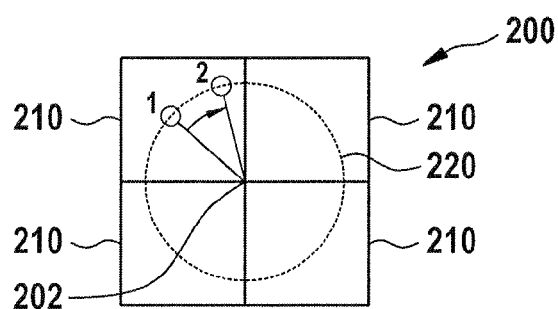
FIG. 2 shows a rotation of a signal charged particle sub-beam on a detector plane according to embodiments described herein.
Figure 3A:
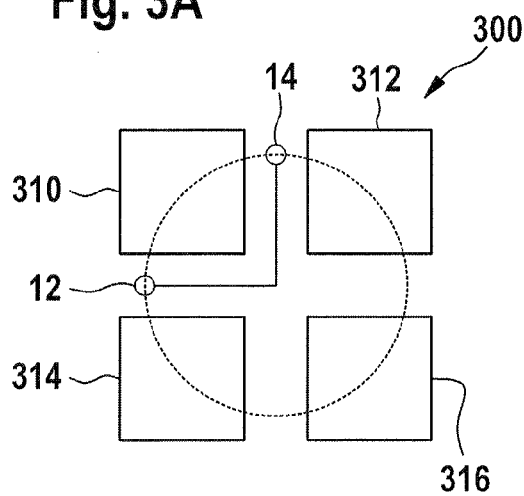
FIGS. 3A and B show a rotation of signal charged particle sub-beams on a detector arrangement according to further embodiments described herein.

FIG. 2 shows a rotation of a signal charged particle sub-beam on a detector plane 200 according to embodiments described herein. FIGS. 3A and B show a rotation of signal charged particle sub-beams on a detector arrangement 300 according to embodiments described herein.

The detector plane 200 is divided into two or more segments 210, which can correspond to detection elements separated from each other (for illustration purposes the spacing between the segments is not shown in FIG. 2). Although FIG. 2 shows 4 segments, it is to be understood that any suitable number of segments can be provided, such as less than 4 segments or more than 4 segments.

The rotational position of the signal charged particle sub-beams (the signal charged particle spot pattern) is not a fixed value, but can depend on operating parameters of the charged particle beam device, for example, used in an image mode (IM). The image mode can be defined by the operating parameters of the charged particle beam device, such as an electron microscope. The operating parameters may include at least one of an electron landing energy LE (keV) on the sample, an extraction field G (V/mm), a beam energy BE (keV) inside the column, and a working distance WD (mm).

While beam energy BE and working distance WD can be kept fixed, the landing energy LE and the extraction field G are frequently readjusted to get the best imaging performance from a given sample. These changes, which may influence the refractive power of an objective lens of the charged particle beam device, can impact the signal charged particle beam, which experiences the changes in the fields acting on the primary charged particle beam. The field changes can lead to focus and magnification changes as well as to a change of Larmor rotation of the signal charged particle spot pattern in the detector plane 200.

According to some embodiments, which can be combined with other embodiments described herein, the coil is configured to rotate the first signal charged particle sub-beam and the second signal charged particle sub-beam around an axis 202 in a plane perpendicular to the axis 202. The axis 202 can correspond to, or be, the longitudinal axis A of the coil. The plane perpendicular to the axis 202 can be substantially parallel to the detector plane 200. As illustrated in FIG. 2, a signal charged particle sub-beam is rotated by the magnetic field generated by the coil from a first position 1 to a second position 2. The rotation can be a rotation around the longitudinal axis. In the plane perpendicular to the axis 202, the rotation may correspond to a movement of the signal charged particle sub-beam on a circular path 220.

In some implementations, the coil is configured to rotate the first signal charged particle sub-beam and the second signal charged particle sub-beam by an angle in a range of between +30° and −30°, specifically by an angle in a range of between +20° and −20°, and more specifically by an angle in a range of between +10° and −10°. The positive angle values can indicate a clockwise rotation when seen from the detector arrangement side. The negative angle values can indicate a counter-clockwise rotation when seen from the detector arrangement side.

Turning now to FIGS. 3A and B, the detector arrangement 300 has two or more detector elements, such as a first detector element 310, a second detector element 312, a third detector element 314, and a fourth detector element 316. Although FIGS. 3A and B show 4 detector elements, it is to be understood that any suitable number of detector elements can be provided, such as less than 4 or more than 4 detector elements.

According to some embodiments, which can be combined with other embodiments described herein, the distance d between adjacent detector elements, e.g., the centers thereof, can be at least 1 mm, specifically at least 5 mm, and more specifically at least 10 mm. In some implementations, the distance d is about 5 mm.

In FIG. 3A, the first signal charged particle sub-beam 12 and the second signal charged particle sub-beam 14 are shown before the rotation correction using the coil of the present disclosure. The first signal charged particle sub-beam 12 and the second signal charged particle sub-beam 14 are directed to a space between the detector elements, such that the first signal charged particle sub-beam 12 and the second signal charged particle sub-beam 14 cannot be detected by the detector arrangement 300.

Figure 3B:
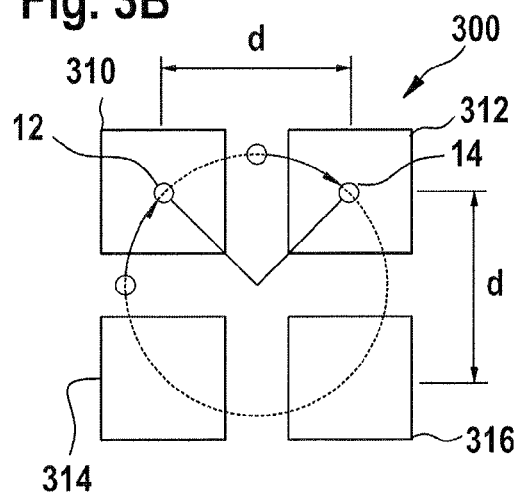

In FIG. 3B, the first signal charged particle sub-beam 12 and the second signal charged particle sub-beam 14 are shown after the rotation correction using the coil of the present disclosure. The first signal charged particle sub-beam 12 and the second signal charged particle sub-beam 14 are rotated by a defined angle such that the first signal charged particle sub-beam 12 and the second signal charged particle sub-beam 14 are directed towards (and onto) respective detector elements. As an example, the first signal charged particle sub-beam 12 is directed onto the first detector element 310 and the second signal charged particle sub-beam 14 is directed onto the second detector element 312. Accordingly, the first signal charged particle sub-beam 12 and the second signal charged particle sub-beam 14 can be detected by the detector arrangement 300.

FIG. 4 shows a schematic view of the system 400 for imaging of a signal charged particle beam according to further embodiments described herein.

To detect individual signal charged particle sub-beams (beamlets), e.g., on millimeter sized detector elements, a sample plane (also referred to as "wafer object plane"), which may have a spot separation or beamlet separation of about 50 μm, can be magnified on the detector plane or detector image plane, which may have a spacing of about 5 mm. This magnification can be achieved by a magnification optics, such as a two stage secondary electron optics (SEO) including two electrostatic lenses and two deflectors.

According to some embodiments, which can be combined with other embodiments described herein, the signal charged particle optics includes a magnification optics 430 configured to adapt a spacing between the first signal charged particle sub-beam 12 originating from the first spot on the sample and the second signal charged particle sub-beam 14 originating from the second spot on the sample to a spacing (e.g., the distance d) between the first detection element 112 and the second detection element 114 of the detector arrangement 110. The magnification optics 430 is provided in the propagation path of the signal charged particle beam 10. As an example, the magnification optics 430 can be provided on an optical axis 3 of the system 400.

In some implementations, the magnification optics 430 includes one or more electrostatic lenses, such as a first electrostatic lens 432 and a second electrostatic lens 434. The one or more electrostatic lenses can also be referred to as "magnification lenses". The magnification optics 430 can further include one or more deflectors, such as a first deflector 436 and a second deflector 438. The one or more deflectors can be electrostatic deflectors. In particular, the magnification optics 430 does not generate any magnetic field that could affect a rotational position of the signal charged particle sub-beams. In other words, the rotation correction is not performed by the magnification optics 430. Instead, the rotation correction is performed independent from the magnification optics 430, namely by the coil 120.

According to some embodiments, which can be combined with other embodiments described herein, the coil 120 is positioned in a drift space in front of the detector arrangement 110. In particular, the coil 120 can be provided directly in front of the one or more detector elements, wherein no further optical elements such as deflectors or lenses are provided between the one or more detector elements and the coil 120. In some implementations, the coil 120 is positioned between the detector arrangement 110 (e.g., the one or more detector elements) and the magnification optics 430. As an example, the coil 120 can be placed in the drift space between the second electrostatic lens 434 and the detector arrangement 110.

FIG. 5 shows a schematic view of the system 500 for imaging of a signal charged particle beam according to yet further embodiments described herein. The system 500 is provided within a vacuum housing 520.

According to some embodiments, which can be combined with other embodiments described herein, the system 500 includes a magnetic shielding device 510 at least partially enclosing the coil 120. The magnetic shielding device can be made of a soft-magnetic material, such as Mu-metal or permalloy. The magnetic shielding device 510 can reduce or even prevent a leakage of magnetic field lines from the coil 120 to the outside of the magnetic shielding device 510. Elements of the charged particle beam device outside the magnetic shielding device 510, such as the magnification optics 430, are not influenced by the magnetic field generated by the coil 120. A reliable functioning of the charged particle beam device, for example, of the magnification optics 430, can be ensured.

In some implementations, the magnetic shielding device 510 can have an inlet opening 512 through which the signal charged particle beam can enter the magnetic shielding device 510 and the coil 120 provided therein. As an example, the inlet opening 512 can be provided in front of the magnification optics 430, and particularly in front of the second electrostatic lens 434. The inlet opening 512 can be provided substantially symmetrically around the optical axis 3.

According to some embodiments, the magnetic shielding device 510 is made of a single piece of material. In further embodiments, the magnetic shielding device 510 consists of two or more elements mounted together. As an example, the magnetic shielding device 510 can be made of two separate parts, such as a flange and a tube.

Figure 6:
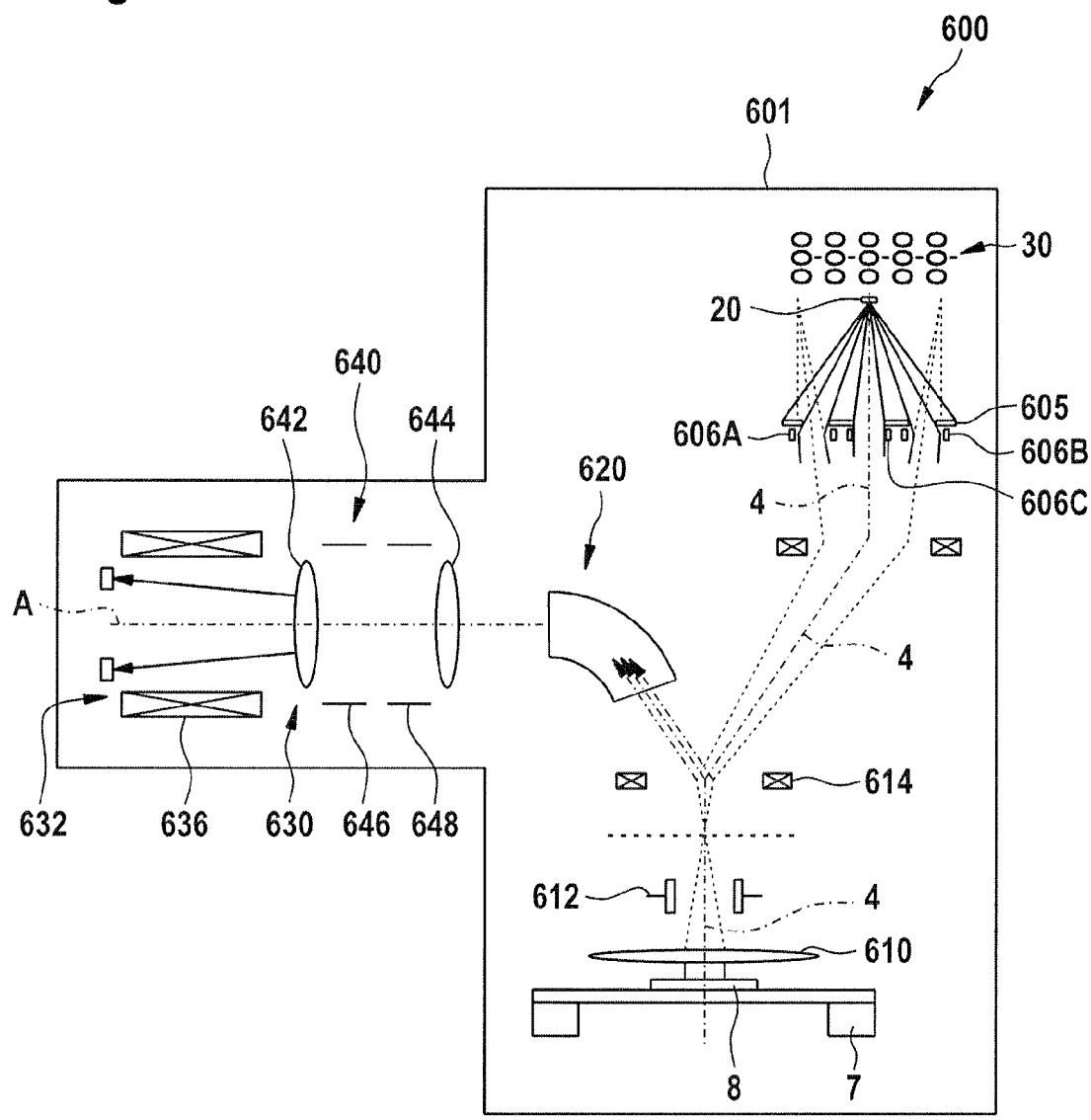
FIG. 6 shows a schematic view of a charged particle beam device according to embodiments described herein.

FIG. 6 shows a schematic view of a charged particle beam device 600 according to embodiments described herein. The charged particle beam device 600 can be, for example, an electron microscope for electron beam inspection (EBI).

The charged particle beam device 600 has a column with a column housing 601. The charged particle beam device 600 further includes a charged particle beam emitter 20 configured for emission of a primary charged particle beam, a sample stage 7 configured for supporting a sample 8, an objective lens 610 configured for focusing the primary charged particle beam onto the sample 8, and a beam separator 614 configured for separating the primary charged particle beam and a signal charged particle beam formed upon impact of the primary charged particle beam onto the sample 8. The primary charged particle beam impinging on the sample 8 consists of multiple primary charged particle sub-beams spaced apart from each other. Likewise, the signal charged particle beam emanating from the sample 8 consists of multiple signal charged particle sub-beams spaced apart from each other.

The charged particle beam device 600 further includes the system 630 for imaging the signal charged particle beam emanating from the sample 8 according to the embodiments described herein. The system 630 particularly includes the detector arrangement 632 and the coil 636. FIG. 6 further shows the magnification optics 640 having, in this order, the first electrostatic lens 642, the first deflector 646, the second deflector 648, and the second electrostatic lens 644.

The charged particle beam emitter 20, for example, an electron beam source, such as a field emitter, emits the primary charged particle beam. In some implementations, the primary charged particle beam passes through an aperture plate 605 having a plurality of aperture openings in order to create the multiple primary charged particle sub-beams. A plurality of deflectors, such as deflectors 606A, 606B, and 606C, can be provided to influence the primary charged particle sub-beams (beamlets) generated by the passage of the primary charged particle beam emitted from charged particle beam emitter 20 through the aperture openings. The individual deflectors 606A-C can influence the signal charged particle sub-beams such that a plurality of virtual charged particle sources are provided. In particular, the charged particles of the signal charged particle sub-beams appear to be emitted from different locations in a plane of the charged particle beam emitter 20 perpendicular to an optical axis 4 of the charged particle beam device 600. In the example shown in FIG. 6, an array of 3×5 sources (see schematic array) is provided. The center source corresponds to the charged particle beam emitter 20. The other 14 sources are virtual sources with an off-set in a plane perpendicular to the optical axis 4. The beam spacing in the array 30 can be minimized such that a maximum number of beams can be created and, on the other hand, the resulting multiplicity of signal charged particle sub-beams can still be kept separated from each other for registration.

Although FIG. 6 illustrates the generation of multiple primary charged particle sub-beams using the aperture plate 605, it is to be understood that the present disclosure is not limited thereto. Other devices suitable for generation of multiple primary charged particle sub-beams for impingement on separated spots on the sample 8 can be used.

According to some embodiments, which can be combined with other embodiments described herein, the charged particle beam device 600 includes the beam separator 614 configured for separating the primary charged particle sub-beams from the signal charged particle sub-beams. As an example, the beam separator 614 can include one or more deflectors, such as one or more magnetic deflectors or a Wien Filter.

The charged particle beam device 600 can include one or more scanning deflectors 612 configured to scan the primary charged particle sub-beams over a surface of the sample 8. The primary charged particle sub-beams, which appeared to be emitted from the array 30, are focused on the sample 8 using the objective lens 610. According to some embodiments, which can be combined with other embodiments described herein, the objective lens 610 can be an electrostatic magnetic component lens, particularly having an electrostatic compound that reduces the energy within the column from a high energy within the column to a lower landing energy. As an example, the energy reduction from the column energy to the landing energy is at least a factor of 10, for example at least a factor of 30. The objective lens 610 can be a compound electrostatic-magnetic objective lens, which collects and accelerates the signal charged particle sub-beams back into the column where signal charged particle sub-beams can be separated from the primary charged particle beam using the beam separator.

The signal charged particle sub-beams originating from the spots on the sample 8 can include particles, such as secondary electrons (SE), released and/or backscattered from the sample and may carry information about the sample 8. The information can include information about the topography of the sample 8, chemical constituents, electrostatic potential, and others. The signal charged particle sub-beams are separated from the primary charged particle sub-beams using the beam separator and enter a signal charged particle deflection device 620. The signal charged particle deflection device 620 can include, for example, a beam bender, such as a hemispherical or sector beam bender. The signal charged particle sub-beams then pass through the system 630 for detection.

The system and the charged particle beam device of the present disclosure can be configured to implement the method for imaging a signal charged particle beam described in the following.

Figure 7:
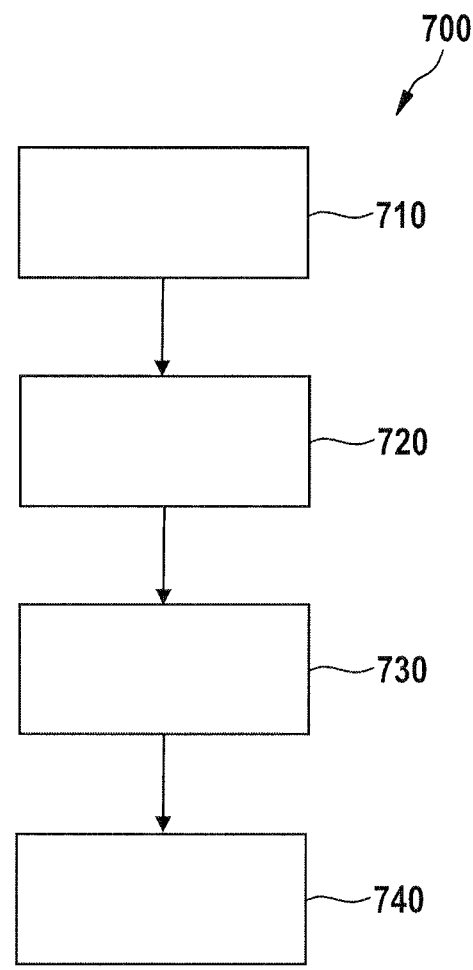
FIG. 7 shows a flowchart of a method for imaging a signal charged particle beam according to embodiments described herein.

FIG. 7 shows a flowchart of a method 700 for imaging a signal charged particle beam according to embodiments described herein. The method 700 can utilize the systems and the charged particle beam device according to the embodiments described herein.

The method 700 includes in block 710 a directing of a primary charged particle beam having a plurality of primary charged particle sub-beams onto the sample to generate a first signal charged particle sub-beam of the signal charged particle beam originating from a first spot on the sample and a second signal charged particle sub-beam of the signal charged particle beam originating from a second spot on the sample. The method 700 further includes in block 720 a guiding of the first signal charged particle sub-beam and the second signal charged particle sub-beam through a coil, in block 730 a rotating of the first signal charged particle sub-beam and the second signal charged particle sub-beam around a longitudinal axis of the coil using a magnetic field of the coil, and in block 740 a detecting of the first signal charged particle sub-beam by a first detection element and a detecting of the second signal charged particle sub-beam by a second detection element spaced apart from the first detection element.

The first spot and the second spot are separated from each other. In some implementations, a spacing between adjacent spots (e.g., a distance between centers or middle portions of the spots), such as between the first spot and the second spot, can be at least 1 μm, specifically at least 10 μm, specifically at least 50 μm, and more specifically at least 100 μm. As an example, the spacing between the first spot and the second spot can be about 50 μm. According to some embodiments, adjacent spots do not overlap each other. Likewise, the primary charged particle sub-beams impinging on the sample are separated from each other. The spacing of the primary charged particle sub-beams at the sample corresponds to the spacing between the spots, such as the first spot and the second spot. In some implementations, a spacing between adjacent primary charged particle sub-beams (e.g., a distance between centers or middle portions of the sub-beams) at the sample can be at least 1 μm, specifically at least 10 μm, specifically at least 50 μm, and more specifically at least 100 μm. As an example, the spacing between adjacent primary charged particle sub-beams at the sample can be about 50 μm.

In some implementations, the method 700 further includes an adapting of a spacing between the first signal charged particle sub-beam originating from the first spot and the second signal charged particle sub-beam originating from the second spot to the spacing between the first detection element and the second detection element. The spacing between the first signal charged particle sub-beam originating from the first spot and the second signal charged particle sub-beam originating from the second spot can correspond to the spacing between the first spot and the second spot as described above. The adapting of the spacing can be conducted using the magnification optics as described with respect to FIG. 4.

According to embodiments described herein, the method for imaging a signal charged particle beam can be conducted using computer programs, software, computer software products and the interrelated controllers, which can have a CPU, a memory, a user interface, and input and output means being in communication with the corresponding components of the system for imaging a signal charged particle beam.

Larmor rotation is caused by magnetic lens fields. Electrostatic lenses used e.g. for focusing and magnification of the signal charged particle spot pattern cannot compensate changes in image rotation. Due to the minute spacing of the primary charged particle sub-beams on the sample (e.g., about 50 μm) and the comparably large separation of the detector elements (e.g., about 5 mm), the magnification optics can be configured for a large magnification. This may lead to a large drift space between the last electrostatic lens of the magnification optics and the detector arrangement. This drift space can be utilized for correction of the Larmor rotation. The long coil can be arranged along the drift space which allows to create a large amount of Larmor rotation and at the same time only marginal defocus of the signal charged particle beam, which could be compensated by small modifications of the electrostatic lens excitations.

While the foregoing is directed to embodiments of the disclosure, other and further embodiments of the disclosure may be devised without departing from the basic scope thereof, and the scope thereof is determined by the claims that follow.

The invention claimed is:

1. Charged particle beam device, comprising:
    a charged particle beam emitter configured for emission of a primary charged particle beam;
    a sample stage configured for supporting a sample;
    an objective lens configured for focusing the primary charged particle beam onto the sample;
    a beam separator configured for separating the primary charged particle beam and a signal charged particle beam formed upon impact of the primary charged particle beam onto the sample; and
    a system for imaging a signal charged particle beam emanating from a sample by impingement of a primary charged particle beam, wherein the system comprises:
        a detector arrangement, comprising:

a first detection element for detecting a first signal charged particle sub-beam of the signal charged particle beam originating from a first spot on the sample; and a second detection element for detecting a second signal charged particle sub-beam of the signal charged particle beam originating from a second spot on the sample, wherein the first detection element and the second detection element are separated from each other; and signal charged particle optics, comprising:

a coil configured to generate a magnetic field having a magnetic field component parallel to a longitudinal axis of the coil, wherein the magnetic field acts on the first signal charged particle sub-beam and the second signal charged particle sub-beam propagating along the longitudinal axis, and wherein an aspect ratio of the coil is at least 1; and a controller configured to adjust the magnetic field of the coil such that the first signal charged particle sub-beam is directed towards the first detection element and the second signal charged particle sub-beam is directed towards the second detection element.

2. System for imaging a signal charged particle beam emanating from a sample by impingement of a primary charged particle beam, comprising:

a detector arrangement, comprising:

a first detection element for detecting a first signal charged particle sub-beam of the signal charged particle beam originating from a first spot on the sample; and a second detection element for detecting a second signal charged particle sub-beam of the signal charged particle beam originating from a second spot on the sample, wherein the first detection element and the second detection element are separated from each other; and signal charged particle optics, comprising:

a coil configured to generate a magnetic field having a magnetic field component parallel to a longitudinal axis of the coil, wherein the magnetic field acts on the first signal charged particle sub-beam and the second signal charged particle sub-beam propagating along the longitudinal axis, and wherein an aspect ratio of the coil is at least 1; and a controller configured to adjust the magnetic field of the coil such that the first signal charged particle sub-beam is directed towards the first detection element and the second signal charged particle sub-beam is directed towards the second detection element.

3. The system of claim 2, wherein the coil has a length L along the longitudinal axis and a radius R perpendicular to the longitudinal axis, and wherein the aspect ratio is defined as L/R.

4. The system of claim 2, wherein the aspect ratio is in a range between 1 and 10 or in a range between 1 and 5.

5. The system of claim 2, wherein the coil is configured as a rotation correction device for correction of a rotation of the first signal charged particle sub-beam and the second signal charged particle sub-beam.

6. The system of claim 2, wherein the coil is configured to rotate the first signal charged particle sub-beam and the second signal charged particle sub-beam around the longitudinal axis in a plane perpendicular to the longitudinal axis of the coil.

7. The system of claim 6, wherein the coil is configured to rotate the first signal charged particle sub-beam and the second signal charged particle sub-beam by an angle in a range of between +30° and −30°.

8. The system of claim 2, wherein the coil is positioned in a drift space in front of the detector arrangement.

9. The system of claim 2, further including a magnetic shielding device at least partially enclosing the coil.

10. The system of claim 2, wherein the signal charged particle optics further comprises a magnification optics configured to adapt a spacing between the first signal charged particle sub-beam originating from the first spot and the second signal charged particle sub-beam originating from the second spot to a spacing between the first detection element and the second detection element.

11. The system of claim 10, wherein the magnification optics includes:

one or more electrostatic lenses; and one or more deflectors.

12. The system of claim 10, wherein the coil is positioned between the detector arrangement and the magnification optics.

13. Method for imaging a signal charged particle beam, comprising:

directing a primary charged particle beam having a plurality of primary charged particle sub-beams onto a sample to generate a first signal charged particle sub-beam of the signal charged particle beam originating from a first spot on the sample and a second signal charged particle sub-beam of the signal charged particle beam originating from a second spot on the sample;

guiding the first signal charged particle sub-beam and the second signal charged particle sub-beam through a coil;

rotating the first signal charged particle sub-beam and the second signal charged particle sub-beam around a longitudinal axis of the coil using a magnetic field of the coil; and detecting the first signal charged particle sub-beam by a first detection element and detecting the second signal charged particle sub-beam by a second detection element spaced apart from the first detection element.

14. The method of claim 13, further comprising:

adapting a spacing between the first signal charged particle sub-beam originating from the first spot and the second signal charged particle sub-beam originating from the second spot to the spacing between the first detection element and the second detection element.

15. The method of claim 13, wherein the first spot and the second spot are separated from each other.

16. The method of claim 13, wherein the method is implemented using a system for imaging a signal charged particle beam emanating from a sample by impingement of a primary charged particle beam, the system comprising:

a detector arrangement, comprising:

a first detection element for detecting a first signal charged particle sub-beam of the signal charged particle beam originating from a first spot on the sample; and a second detection element for detecting a second signal charged particle sub-beam of the signal charged particle beam originating from a second spot on the sample, wherein the first detection element and the second detection element are separated from each other; and signal charged particle optics, comprising:
- a coil configured to generate a magnetic field having a magnetic field component parallel to a longitudinal axis of the coil, wherein the magnetic field acts on the first signal charged particle sub-beam and the second signal charged particle sub-beam propagating along the longitudinal axis, and wherein an aspect ratio of the coil is at least 1; and
- a controller configured to adjust the magnetic field of the coil such that the first signal charged particle sub-beam is directed towards the first detection element and the second signal charged particle sub-beam is directed towards the second detection element.

* * * * *